United States Patent
Tanabe

(10) Patent No.: US 8,293,592 B2
(45) Date of Patent: Oct. 23, 2012

(54) METHOD OF MANUFACTURING SEMICONDUCTOR DEVICE AND SUBSTRATE PROCESSING APPARATUS

(75) Inventor: Junichi Tanabe, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 608 days.

(21) Appl. No.: 12/410,836

(22) Filed: Mar. 25, 2009

(65) Prior Publication Data

US 2009/0263971 A1    Oct. 22, 2009

(30) Foreign Application Priority Data

Apr. 16, 2008  (JP) ................................. 2008-106857
Jan. 21, 2009  (JP) ................................. 2009-010610

(51) Int. Cl.
*H01L 21/00* (2006.01)
(52) U.S. Cl. .......... 438/149; 117/88; 117/102; 117/104
(58) Field of Classification Search .................. None
See application file for complete search history.

(56) References Cited

U.S. PATENT DOCUMENTS

| | | | | |
|---|---|---|---|---|
| 5,294,286 A | * | 3/1994 | Nishizawa et al. | 117/93 |
| 2004/0171238 A1 | * | 9/2004 | Arena et al. | 438/507 |
| 2005/0079691 A1 | * | 4/2005 | Kim et al. | 438/481 |
| 2005/0079692 A1 | * | 4/2005 | Samoilov et al. | 438/481 |
| 2006/0216876 A1 | * | 9/2006 | Kim et al. | 438/149 |

FOREIGN PATENT DOCUMENTS

| | | |
|---|---|---|
| JP | 2003-218037 | 7/2003 |
| JP | 2007042671 | 2/2007 |
| JP | 2008-103508 | 5/2008 |
| KR | 20070086439 | 8/2007 |

* cited by examiner

*Primary Examiner* — Duy Deo
(74) *Attorney, Agent, or Firm* — Brundidge & Stanger, P.C.

(57) ABSTRACT

A semiconductor device manufacturing method including: (a) loading into a chamber a substrate having at least an exposed silicon surface and an exposed surface of silicon oxide film or silicon nitride film on a substrate surface; (b) simultaneously supplying at least a first process gas containing silicon and a second process gas for etching into the chamber when the substrate inside the chamber is heated to a predetermined temperature; and (c) supplying into the chamber a third process gas having an etchability higher than the second process gas etchability. Steps (b) and (c) are performed at least once to selectively grow an epitaxial film on the exposed silicon surface of the substrate surface. A temperature of the substrate is maintained at the predetermined temperature from (b) to (c), and the temperature of the substrate is temporarily elevated above the predetermined temperature and then returned to the predetermined temperature in (c).

8 Claims, 3 Drawing Sheets

METHOD OF MANUFACTURING SEMICONDUCTOR DEVICE AND SUBSTRATE PROCESSING APPARATUS

CROSS-REFERENCE TO RELATED PATENT APPLICATION

This U.S. non-provisional patent application claims priority under 35 U.S.C. §119 of Japanese Patent Application Nos. 2008-106857, filed on Apr. 16, 2008, and 2009-010610, filed Jan. 21, 2009, in the Japanese Patent Office, the entire contents of which are hereby incorporated by reference.

BACKGROUND OF THE INVENTION

1. Field of the Invention

The present invention relates to a method of manufacturing a semiconductor device and a substrate processing apparatus, and more particularly, to a method of manufacturing a semiconductor device, which includes a process of selectively growing a silicon epitaxial film on a source/drain of a substrate used in the production of Metal-Oxide-Semiconductor Field Effect Transistor (MOSFET), and a substrate processing apparatus using the same.

2. Description of the Prior Art

With high integration density and high performance of MOSFET, both of the improved substrate characteristics and the miniaturization are required simultaneously. To meet this requirement, the source/drain of the MOSFET are required to have the reduced leakage current and the low resistance. One approach to solving those problems is to selectively growing a silicon epitaxial film on the source/drain.

There are two conventional methods of growing a selective epitaxial film: a method of supplying a film-forming gas and an etching gas simultaneously and a method of supplying a film-forming gas and an etching gas alternately.

In the case of supplying the film-forming gas and the etching gas simultaneously, it is difficult to ensure both the selectivity and the film thickness uniformity. If the selectivity is increased, the uniformity is significantly degraded because the central part of the substrate gets thick, whereas the peripheral part gets thin. On the other hand, if the uniformity is ensured, there is a problem in that the selectivity is degraded and thus a film is also formed on an insulation film. Furthermore, the process control is difficult because process parameters are increased very much, and the film-forming rate is greatly reduced because the etching gas is introduced during the film formation.

Meanwhile, in the case of supplying the film-forming gas and the etching gas alternately, a film-forming step for a film formation only and an etching step for an etching process only are performed. However, in the film-forming step, there is a problem that conditions capable of ensuring the selectivity are narrow, in order to perform the selective growth by using difference of growth start time on the silicon and the insulation film. Furthermore, when removing nuclei formed on the insulation film by using gas having a strong etchability, an etching amount is changed due to the etching dependence caused by difference of the film quality of a polysilicon film on the substrate or a silicon substrate, and thus, some regions are etched more than necessary.

Therefore, in the simultaneously supplying process or the alternately supplying process according to the related art, it is difficult to grow a sufficiently thick epitaxial film while maintaining the selectivity and the film thickness uniformity in the substrate plane.

SUMMARY OF THE INVENTION

To solve the above problems, an object of the present invention is to provide a method of manufacturing a semiconductor device, which is capable of growing a sufficiently thick epitaxial film while maintaining the selectivity and the film thickness uniformity in a substrate plane, and a substrate processing apparatus.

According to an aspect of the present invention, there is provided a method of manufacturing a semiconductor device, including: (a) loading a substrate into a process chamber, the substrate having at least an exposed silicon surface and an exposed surface of silicon oxide film or silicon nitride film on a substrate surface; (b) simultaneously supplying at least a first process gas containing silicon and a second process gas for etching into the process chamber under a condition that the substrate inside the process chamber is heated to a predetermined temperature; and (c) supplying a third process gas having a etchability higher than that of the second process gas into the process chamber, wherein steps (b) and (c) are performed one or more times so that an epitaxial film is selectively grown on the exposed silicon surface of the substrate surface, and wherein a temperature of the substrate is maintained at the predetermined temperature when proceeding from the step (b) to the step (c), and the temperature of the substrate is temporarily elevated to be higher than the predetermined temperature in the step (c) and then returned to the predetermined temperature in the step (c).

According to another aspect of the present invention, there is provided a method of manufacturing a semiconductor device, including: (a) loading a substrate into a process chamber, the substrate having at least an exposed silicon surface and an exposed surface of silicon oxide film or silicon nitride film on a substrate surface; (b) selectively forming a film on the exposed silicon surface of the substrate by supplying at least a first process gas containing silicon and a second process gas for etching into the process chamber at a first flow rate under conditions that an inside pressure of the process chamber is at a first pressure and the substrate inside the process chamber is heated to a first temperature; and (c) removing silicon nuclei on the silicon oxide film or the silicon nitride film under one of conditions that the inside pressure of the process chamber is adjusted to be higher than the first pressure and the second process gas is supplied at a flow rate higher than the first flow rate, wherein step (b) and step (c) are performed one or more times, and wherein a temperature of the substrate is maintained at the first temperature when proceeding from the step (b) to the step (c), and the temperature of the substrate is temporarily elevated to be higher than the predetermined temperature in the step (c) and then returned to the predetermined temperature in the step (c) to selectively grow an epitaxial film on the exposed silicon surface of the substrate surface.

According to another aspect of the present invention, there is provided a substrate processing apparatus comprising: a process chamber accommodating a substrate; a heating mechanism heating the substrate; a gas supply unit supplying a process gas into the process chamber in order to form a predetermined film; a gas exhaust unit exhausting atmosphere inside the process chamber by making the inside of the process chamber to a predetermined pressure; and a control unit controlling the heating mechanism, the gas supply unit, and the gas exhaust unit, so that a film is selectively formed on a silicon exposure surface of the substrate by supplying at least a first process gas containing silicon and a second process gas for etching into the process chamber under conditions that pressure inside the process chamber is at a first pressure and the substrate inside the process chamber is heated to a first temperature, and silicon nuclei on silicon oxide film or silicon nitride film are removed under conditions that the pressure inside the process chamber is made higher than the first pressure, or the temperature of the substrate inside the process chamber is higher than the first temperature, or a third process gas having a stronger etchability than the second process gas is supplied

DETAILED DESCRIPTION OF THE PREFERRED EMBODIMENTS

<First Embodiment>

Figure 1:
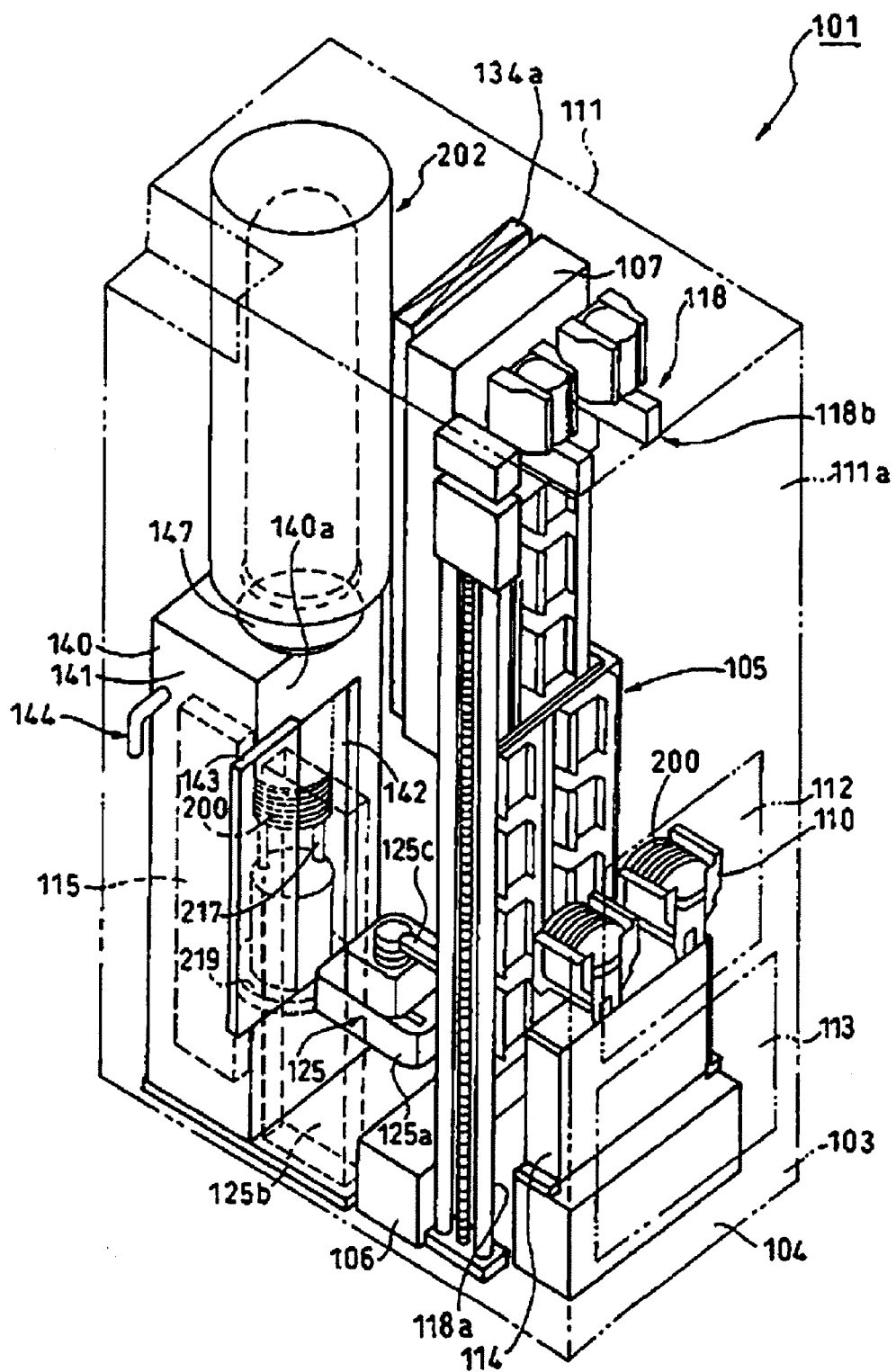
FIG. 1 is a schematic perspective view for explaining a substrate processing apparatus in accordance with a preferred embodiment of the present invention.

In a preferred embodiment of the present invention, a substrate processing apparatus is configured as a semiconductor manufacturing apparatus which performs a processing operation of manufacturing a semiconductor device (IC) or the like. The following explanation will be given on a vertical-type substrate processing apparatus (hereinafter, simply referred to as a processing apparatus) which performs an oxidation process, a diffusion process, or a chemical vapor deposition (CVD) process on a substrate.

A first embodiment of the present invention will be described below.

In accordance with the first embodiment of the present invention, in the first step, a silicon substrate having a silicon nitride film or a silicon oxide film on at least a part of its surface, with a silicon surface being exposed, is loaded into a process chamber. Then, an etching gas, such as hydrogen gas, fluoride gas or hydrogen chloride gas is supplied simultaneously with silane-based gas into the process chamber (in the case of growing a SiGe mixed film, germanium-based gas is also supplied). In this way, a silicon epitaxial film is selectively grown only on the silicon surface, while suppressing the silane-based or germanium-based gas from reacting in a vapor phase. In the second step, silicon atoms attached to a silicon nitride film or a silicon oxide film are removed by supplying only an etching gas such as chlorine gas having a higher etchability than the etching gas used in the first step. The selective epitaxial growth is achieved by repeating the first step and the second step sequentially a predetermined number of times. In this way, the sufficiently thick epitaxial film can be grown, while maintaining the selectivity and the film thickness uniformity in the substrate plane.

Herein, the etching gas is used in the film-forming step being the first step and the etching step being the second step. The first step is characterized in that the gas having a weak etchability, such as hydrogen chloride gas, is used. Thus, it is possible to selectively form a film having excellent film thickness uniformity on the silicon surface over the substrate. Furthermore, by using the gas such as hydrogen chloride having the weak etchability, it is possible to prevent only the peripheral part of the substrate from being etched extremely, and it is possible to improve the film thickness uniformity in the substrate plane. Moreover, it is possible to reduce the difference of the etchability due to the film quality of the silicon nitride film, the oxide film, the silicon polycrystalline film or a single-crystal film on the substrate surface.

However, since the etchability is weak, silicon nuclei are formed on the insulation film such as the silicon nitride film or the silicon oxide film in the initial stage of the silicon film formation. In the second step, the silicon nuclei formed on the insulation film can be removed at a low flow rate in a short time by using gases having the strong etchability, for example, fluorine and fluorine compound gases such as fluorine gas, hydrogen fluoride gas and nitrogen trifluoride gas, or chlorine-based gases such as chlorine gas and chlorine trifluoride gas. Furthermore, since the etching can be achieved in a short time, it is possible to reduce the thermal damage of the substrate, which may cause degradation of device characteristics, such as impurity diffusion or shape deformation. Moreover, it is possible to improve the throughput.

Next, the structure of the processing apparatus in accordance with the first embodiment of the present invention will be described in detail with reference to the attached drawings.

As shown in FIG. 1, the processing apparatus 101 in accordance with the embodiment of the present invention is provided with a housing 111. In the processing apparatus 101, a cassette 110 is used as a wafer carrier accommodating wafers (substrates) 200 made of silicon or the like. At the lower part of a front wall 111a of the housing 111, a front maintenance gate 103 is installed as an opening part for maintenance, and a front maintenance door 104 is installed to open and close the front maintenance gate 103. At the front maintenance door 104, a cassette carrying in/out opening (substrate container carrying in/out opening) 112 is provided in communication with the inside and outside of the housing 111, and the cassette carrying in/out opening 112 is designed to be opened and closed by a front shutter (mechanism for opening and closing the substrate container carrying in/out opening) 113. At the housing (111) interior of the cassette carrying in/out opening 112, a cassette stage (substrate container delivery table) 114 is installed. The cassette 110 is carried onto or out of the cassette stage 114 by an in-plant carrying device (not shown). The cassette stage 114 is designed so that the wafers 200 inside the cassette 110 are arranged vertically and a wafer entrance/exit opening of the cassette 110 is placed to face in the upper direction.

At an approximately central lower part of the housing 111 in the front and rear direction, a cassette shelf (substrate container placement shelf) 105 is installed, and the cassette shelf 105 is designed to accommodate a plurality of cassettes 110 in multiple stages and multiple columns, and to enter and exit the wafers 200 into/from the cassette 110. The cassette shelf 105 is installed to be movable transversely on a slide stage (horizontal movement mechanism) 106. Furthermore, at the upward part of the cassette shelf 105, a buffer shelf (substrate container storage shelf) 107 is installed to store the cassette 110.

A cassette carrying device (substrate container carrying device) 118 is installed between the cassette stage 114 and the cassette shelf 105. The cassette carrying device 118 is configured by a cassette elevator (substrate container elevating mechanism) 118a, which can move upward and downward while holding the cassette 110, and a cassette carrying mechanism (substrate container carrying mechanism) 118b operating as a carrying mechanism. The cassette carrying device 118 is designed to carry the cassette 110 among the cassette stage 114, the cassette shelf 115 and the buffer shelf 107 by the continuous operations of the cassette elevator 118a and the cassette carrying mechanism 118b.

At the rear part of the cassette shelf 105, a wafer transfer mechanism (substrate transfer mechanism) 125 is installed. The wafer transfer mechanism 125 is configured by a wafer transfer device (substrate transfer device) 125a capable of rotating the wafer 200 in a horizontal direction or moving the wafer 200 straight, and a wafer transfer device elevator (substrate transfer device elevating mechanism) 125b for moving the wafer transfer device 125a upward and downward. As schematically shown in FIG. 1, the wafer transfer device elevator 125b is installed in the left end of the housing 111. By the continuous operations of the wafer transfer device elevator 125b and the wafer transfer device 125a, the wafer 200 is charged/discharged into/from a boat (substrate holding tool) 217 by using tweezers (substrate holder) 125c of the wafer transfer device 125a as a wafer placement unit.

As shown in FIG. 1, at the rear part of the buffer shelf 107, a clean unit 134a configured by a supply fan and a dust-proof filter is installed to supply clean air that is a purified atmosphere, so that the clean air is circulated through the inside of the housing 111. Furthermore, at the right end opposite to the wafer transfer device elevator 125b, a clean unit (not shown) configured by a supply fan and a dust-proof filter is installed to supply clean air, and clean air blown from the clean unit is circulated through the wafer transfer device 125a, sucked by an exhaust device (not shown) and then exhausted to the outside of the housing 111.

A the rear part of the wafer transfer device (substrate transfer device) 125a, a housing (hereinafter, referred to as a pressure-resistant housing) 140 having a sealing performance capable of maintaining pressure lower than atmospheric pressure (hereinafter, referred to as a negative pressure) is installed, and a loadlock chamber 141 having a volume enough to accommodate the boat 217 is formed by the pressure-resistant housing 140.

At a front wall 140a of the housing 140, a wafer carrying in/out opening (substrate carrying in/out opening) 142 is installed so that it is opened and closed by a gate valve (substrate carrying in/out opening/closing mechanism) 143. At a pair of sidewalls of the pressure-resistant housing 140, a gas supply pipe 141 for supplying inert gas such as nitrogen gas to the loadlock chamber 141 and an exhaust pipe (not shown) for exhaust the loadlock chamber 141 to the negative pressure are connected.

At the upward part of the loadlock chamber 141, a process furnace 202 is installed. The lower part of the process furnace 202 is designed to be opened and closed by a furnace port gate valve (furnace port opening/closing mechanism) 147.

As schematically shown in FIG. 1, a boat elevator (substrate holder elevating mechanism) 115 for moving the boat 217 upward and downward is installed in the loadlock chamber 141. At an arm (not shown) serving as a connecting tool connected to the boat elevator 115A, a seal cap 219 is transversely installed as a cover. The seal cap 219 is configured to support the boat 217 vertically and close the lower end of the process furnace 202.

The boat 217 includes holding members in multiple lines and is configured to hold a plurality of sheets (for example, from about 50 to 150 sheets) of wafers 200 at a horizontal position, with their centers aligned vertically.

Next, explanation will be given on the operation of the processing apparatus in accordance with the first embodiment of the present invention.

As shown in FIG. 1, before the cassette 110 is supplied to the cassette stage 114, the cassette carrying in/out opening 112 is opened by the front shutter 113. Thereafter, the cassette 110 is carried in from the cassette carrying in/out opening 112 and then is placed on the cassette stage 114 so that the wafer 200 takes a horizontal position and the wafer entrance/exit port of the cassette 110 faces in the upward direction.

Then, the cassette 110 is picked up from the cassette stage 114 by the cassette transfer device 118 and simultaneously it turns right to the rearward of the housing and rotates 90 degrees in a longitudinal direction, so that the wafer 200 takes a horizontal position and the wafer entrance/exit port of the cassette 110 faces the rear part of the housing. Subsequently, the cassette 110 is automatically carried to a designated shelf position between the cassette shelf 105 and the buffer shelf 107 by the cassette carrying device 118 and then is temporarily deposited. Thereafter, the cassette 110 is transferred to the cassette shelf 105 by the cassette carrying device 118. Alternately, the cassette 110 is carried directly to the cassette shelf 105.

The slide stage 106 horizontally moves the cassette shelf 105, so that the cassette 110 to be transferred is positioned to face the wafer transfer device 125a.

If the wafer carrying in/out opening 142 of the loadlock chamber 141 which has been previously kept at the atmospheric pressure is opened by the operation of the gate valve 143, the wafer 200 is picked up from the cassette 110 through the wafer entrance/exit port by the tweezers 125c of the wafer transfer device 125a, loaded into the loadlock chamber 141 through the wafer carrying in/out opening 142, and then transferred to and charged into the boat. The wafer transfer device 125a which has delivered the wafer 200 to the boat 217 returns to the cassette 110 and charges the boat 217 with a next wafer 110.

If the boat 217 is charged with a predetermined number of wafers 200, the wafer carrying in/out opening 142 is closed by the gate valve 143, the loadlock chamber 141 is vacuum-exhausted through the exhaust pipe so that it is depressurized. If the loadlock chamber 141 is depressurized to the same pressure as that of the process furnace 202, the lower end of the process furnace 202 is opened by the throat port gate valve 147. Subsequently, the seal cap 219 is moved upward by the boat elevator 115, and the boat 217 supported by the seal cap 219 is loaded into the process furnace 202.

After the loading, the wafer 200 is processed within the process furnace 202. After the processing, the boat 217 is unloaded by the boat elevator 115. The inside of the loadlock chamber 140 is recovered to the atmospheric pressure and then the gate valve 143 is opened. Thereafter, the wafer 200 and the cassette 110 are withdrawn to the outside of the housing 111 in the opposite procedure to that described above.

Next, explanation will be given on the process furnace 202 of the processing apparatus in accordance with the first embodiment of the present invention.

Figure 2:
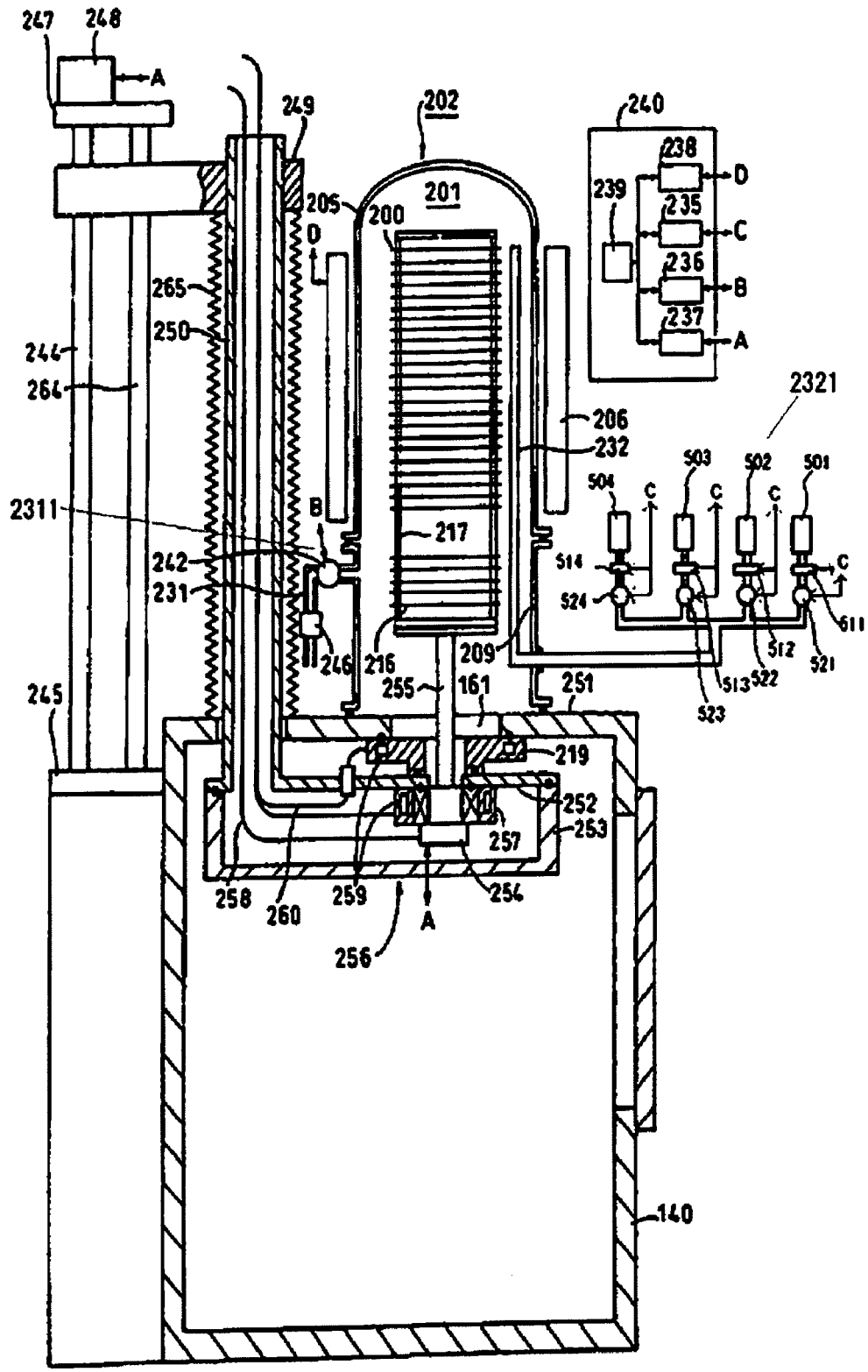
FIG. 2 is a schematic longitudinal sectional view for explaining the substrate processing apparatus in accordance with the preferred embodiment of the present invention.

FIG. 2 is a vertical sectional view schematically showing the process furnace 202 and its nearby parts in the processing apparatus in accordance with the first embodiment of the present invention.

As shown in FIG. 2, the processing furnace 202 includes a heater 206 as a heating mechanism. The heater 206 is formed in a cylindrical shape and is configured by a heater wire and a heat insulation member installed around the heater wire. The heater 206 is supported by a holding plate (not shown) so that the heater 206 is installed vertically.

At the inside of the heater 206, an outer tube 205 as a reaction tube is installed concentrically with the heater 206. The outer tube 205 is made of a heat-resistant material, such as quartz ($SiO_2$) or silicon carbide (SiC), and is formed in a cylindrical shape with an upper part closed and a lower part opened. At the cylindrical hollow part which is the inside of the outer tube 205, a process chamber 201 is formed so that it accommodates a plurality of wafers (substrates) 200 which are arranged at a horizontal position in a vertical direction along multiple stages by a boat 217 as described later.

At the lower part of the outer tube 205, a manifold 209 is installed concentrically with the outer tube 205. The manifold 209 is made of a material such as stainless steel and is formed in a cylindrical shape with its upper and lower parts opened. The manifold 209 is installed to support the outer tube 205. An O-ring as a seal member is installed between the manifold 209 and the outer tube 205. The manifold 209 is supported to a holding plate (not shown), so that the outer tube 205 is installed vertically. A reaction vessel is formed by the outer tube 205 and the manifold 209.

At the manifold 209, a gas exhaust pipe 231 is installed and simultaneously a gas supply pipe 232 is installed to pass therethrough. The gas supply pipe 232 is divided into four branched pipes at the upstream side, which are respectively connected to a first gas supply source 501, a second gas supply source 502, a third gas supply source 503 and a fourth gas supply source 504 through valves 521, 522, 523 and 524 and mass flow controllers (MFCs) 511, 522, 523 and 524 as gas flow rate control devices. At the MFCs 511, 512, 513 and 514 and the valves 521, 522, 523 and 524, a gas flow rate control unit 235 is connected electrically to control a flow rate of the supplied gas to a desired level at a desired timing. The gas supply pipe 232, the valves 521, 522, 523 and 524, the MFCs 511, 512, 513 and 514, the first gas supply source 501, the second gas supply source 502, the gas supply source 503, and the fourth gas supply source 504 constitute a gas supply unit 2321. The gas supply unit is not limited to the above structure. For example, a plurality of gas supply units 232 may be installed. Furthermore, for example, the valve 521, the MFC 511, and the first gas supply source 501 may be configured as a first gas supply unit by installing a gas supply pipe separately from the other valves, MFCs and gas supply sources. Also, the valve 522, the MFC 512, aid the second gas supply source 502 may be configured as a second gas supply unit by installing a gas supply pipe separately from the other valves, MFCs and gas supply sources. Also, the valve 523, the MFC 513, and the third gas supply source 503 may be configured as a third gas supply unit by installing a gas supply pipe separately from the other valves, MFCs and gas supply sources. Also, the valve 524, the MFC 514, and the first gas supply source 504 may be configured as a first gas supply unit by installing a gas supply pipe separately from the other valves, MFCs and gas supply sources.

At the downstream side of the gas exhaust pipe 231, a vacuum exhaust device 246 such as a vacuum pump is connected through a pressure sensor (not shown) as a pressure detector and an automatic pressure controller (APC) valve as a pressure regulator. A pressure control unit 236 is electrically connected to a pressure sensor and an APC valve 242, and is configured to make the pressure inside the process chamber 201 to a desired level at a desired timing by adjusting the opening degree of the APC valve 242, based upon the pressure detected by the pressure sensor. The gas exhaust pipe 231, the pressure sensor, the APC valve 242, and the vacuum exhaust device 246 constitute a gas exhaust unit 2311 which exhausts the atmosphere of the process chamber 201 by making the pressure inside the process chamber 201 to a predetermined level.

At the downward part of the manifold 209, the seal cap 219 is installed as a furnace port lid for air-tightly closing the lower opening of the manifold 209. The seal cap 219 is made of a metal such as stainless steel and is formed in a disk shape. On the top of the seal cap 219, an O-ring is installed as a seal member which is in contact with the lower end of the manifold 209. At the seal cap 219, a rotating mechanism 254 is installed. A rotation shaft 255 of the rotating mechanism 254 passes through the seal cap 219 and is connected to the boat 217 which will be described later. The rotating mechanism 254 is configured to rotate the boat 217 so that the wafer 200 is rotated. The seal cap 219 is configured so that it is moved in a vertical direction by a lift motor 248 (which will be described later) serving as an elevating mechanism installed in the outside of the process furnace 202, and thus, the boat 217 can be loaded into or unloaded from the process chamber 201. A driving control unit 237 is electrically connected to the rotating mechanism 254 and the lift motor 248, and is configured so that a desired operation is controlled at a desired timing.

The boat 217 as a substrate holder is made of a heat-resistant material such as quartz or silicon carbide, and is configured to hold a plurality of wafers 200 at a horizontal position, with their centers aligned, in multiple stages. At the lower part of the boat 217, a plurality of disk-shaped heat insulation plates 216 as heat insulation members made of a heat-resistant material such as quartz or silicon carbide are arranged at a horizontal position in multiple stages and are configured to make it difficult to transfer heat from the heater 206 toward the manifold 209.

In the neighborhood of the heater 206, a temperature sensor (not shown) is installed as a temperature detector to detect temperature inside the process chamber 201. A temperature control unit 238 is electrically connected to the heater 206 and the temperature sensor, and is configured to control an electrified state of the heater 206 at a desired timing, based upon temperature information detected by the temperature sensor, in order that temperature inside the processing chamber 201 is made to have a desired temperature distribution.

In the structure of the process furnace 202, a first process gas is supplied from the first gas supply source 501, and its flow rate is controlled by the MFC 511. Then, the first process gas is introduced through the valve 521 to the inside of the process chamber 201 by the gas supply pipe 232.

A second process gas is supplied from the second gas supply source 502, and its flow rate is controlled by the MFC 512. Then, the second process gas is introduced through the valve 522 to the inside of the process chamber 201 by the gas supply pipe 232.

A third process gas is supplied from the third gas supply source 503, and its flow rate is controlled by the MFC 513. Then, the third process gas is introduced through the valve 523 to the inside of the process chamber 201 by the gas supply pipe 232.

A fourth process gas is supplied from the fourth gas supply source 504, and its flow rate is controlled by the MFC 514. Then, the fourth process gas is introduced through the valve 524 to the inside of the process chamber 201 by the gas supply pipe 232.

The gases inside the process chamber 201 are exhausted from the process chamber 201 by the vacuum pump 246 as the exhaust device connected to the gas exhaust pipe 231.

Next, explanation will be given on the parts installed around the process furnace of the processing apparatus in accordance with the first embodiment of the present invention.

A lower base 245 is installed on an outer side of the load-lock chamber 140 used as a preliminary chamber. A guide shaft 264 which is fitted to a lift plate 249 and a ball screw 244 which is screw-coupled to the lift plate 249 are installed on the lower base 245, and an upper base 247 is installed on the top of the guide shaft 264 and the ball screw 244 erected on the lower base 245. The ball screw 244 is rotated by the lift motor 248 installed in the upper base 247. As the ball screw 244 is rotated, the lift plate 249 is moved upward and downward.

At the lift plate 249, a hollow lift shaft 250 is erected, and the lift plate 249 and the lift shaft 250 are air-tightly connected together. The lift shaft 250 is configured to be moved upward and downward together with the lift plate 249. The lift shaft 250 is movably inserted through the top plate 251 of the loadlock chamber 140. A penetration hole of the top plate 251 through which the lift shaft 250 is inserted is large enough to prevent the lift shaft 250 from contacting the top plate 251. Between the loadlock chamber 140 and the lift plate 249, a bellows 265 as a hollow flexible structure having flexibility is installed to enclose the lift shaft 250 for sealing the loadlock chamber 140. The bellows 265 is sufficiently expanded and contracted in accordance with the movement of the lift plate 249 and has an inner diameter sufficiently larger than the outer diameter of the lift shaft 250 so that the bellows 265 does not contact the lift shaft 250 upon its expansion or contraction.

At the lower end of the lift shaft 250, a lift base 252 is horizontally installed. At the bottom of the lift base 252, a driver cover 253 is air-tightly attached through a seal member such as an O-ring. The lift base 252 and the driver cover 253 constitute a driver accommodating case 256. Due to such a structure, the inside of the driver accommodating case 256 is isolated from the inside atmosphere of the loadlock chamber 140.

Furthermore, a boat rotating mechanism 254 is installed inside the driver accommodating case 256, and the surrounding of the boat rotating mechanism 254 is cooled by a cooling mechanism 257.

Power cables 258 are guided from the upper end of the lift shaft 250 through the hollow part of the lift shaft 250 and connected to the rotating mechanism 254. Moreover, cooling passages 259 are formed in the cooling mechanism 257 and the seal cap 219, and a cooling water pipe 260 supplying cooling water is connected to the cooling passages 259 and passes through the hollow part of the lift shaft 250 from its upper end.

As the ball screw 244 rotates upon the driving of the lift motor 248, the driver accommodating case 256 is lifted together with the lift plate 249 and the lift shaft 250.

As the driver accommodating case 256 is lifted, the seal cap 219 closes the furnace port 161 air-tightly, so that the substrate processing apparatus is in a state that the wafer processing can be started. As the driver accommodating case 256 is moved downward, the boat 217 is moved downward together with the seal cap 219, so that the substrate processing apparatus is in a state that the wafer 200 can be carried to the outside.

The gas flow rate controller 235, the pressure control unit 236, the driving control unit 237, and the temperature control unit 238 constitute a manipulation unit and an input/output unit, and are electrically connected to a main control unit 239 which controls the overall operation of the substrate processing apparatus. The gas flow rate control unit 235, the pressure control unit 236, the driving control unit 237, the temperature control unit 238, and the main control unit 239 is configured as a controller 240.

Next, explanation will be given on one of substrate fabrication processes, specifically a method of forming an epitaxial-SiGe (Epi-SiGe) film on a substrate such as a wafer 200 by using the process furnace 202 having the above-described structure. As described below, operations of the respective elements constituting the substrate processing apparatus are controlled by the controller 240.

When a plurality of wafers 200 are charged into the boat 217, as shown in FIG. 2, the boat 217 holding the plurality of wafers 200 is loaded into the process chamber 201 by the lift operation of the lift plate 249 and the lift shaft 250 through the operation of the lift motor 248. In this state, the seal cap 219 seals the lower end of the manifold 209 through the O-ring.

The inside of the process chamber 201 is exhausted by the vacuum exhaust device 246 to a desired pressure (vacuum degree). At this time, the pressure inside the process chamber 201 is measured with a pressure sensor, and the pressure regulator 242 is feedback controlled based upon the measured pressure. In addition, the process chamber 201 is heated by the heater 206 to a desired temperature. In this case, in order to obtain the desired temperature distribution within the process chamber 201, the electrified state of the heater 206 is feedback controlled based upon temperature information detected by the temperature sensor. Thereafter, the rotating mechanism 254 rotates the boat 217 so that the wafers 200 rotate.

The first gas supply source 501, the second gas supply source 502, and the third gas supply source 503, and the fourth gas supply source 504 are filled with silane-based gas or halogen-containing gas, for example dichlorosilane gas ($SiH_2Cl_2$), as the first process gas, hydrogen chloride gas (HCl) as the second process gas, chlorine gas ($Cl_2$) as the third process gas, and hydrogen gas ($H_2$) as the fourth process gas. Then, the respective process gases are supplied from their process gas supply sources. Opening degrees of the MFCs 511, 512, 513 and 514 are adjusted to a desired flow rate and then the valves 521, 522, 523 and 524 are opened so that the respective process gases are circulated through the gas supply pipe 232 and introduced from the upper end of the process chamber 201 to the process chamber 201.

The introduced gases are discharged from the process chamber 201 through the gas exhaust pipe 231. The process gases contact the wafer 200 when passing through the process chamber 201, and the Epi-Si film is epitaxially grown selectively on the surface of the wafer 200.

After a predetermined time passes by, inert gas is supplied from an inert gas supply source (not shown), and the inside of the process chamber 201 is replaced with the inert gas. Simultaneously, the pressure inside the process chamber 201 returns to the normal pressure.

Thereafter, the lift motor 248 is operated to move down the seal cap 219, and simultaneously the lower end of the manifold 209 is opened. The boat 217 charged with the processed wafers 200 is unloaded from the lower end of the manifold 20 to the outside of the outer tube 205. Then, the processed wafers 200 are discharged from the boat 217.

Figure 3:
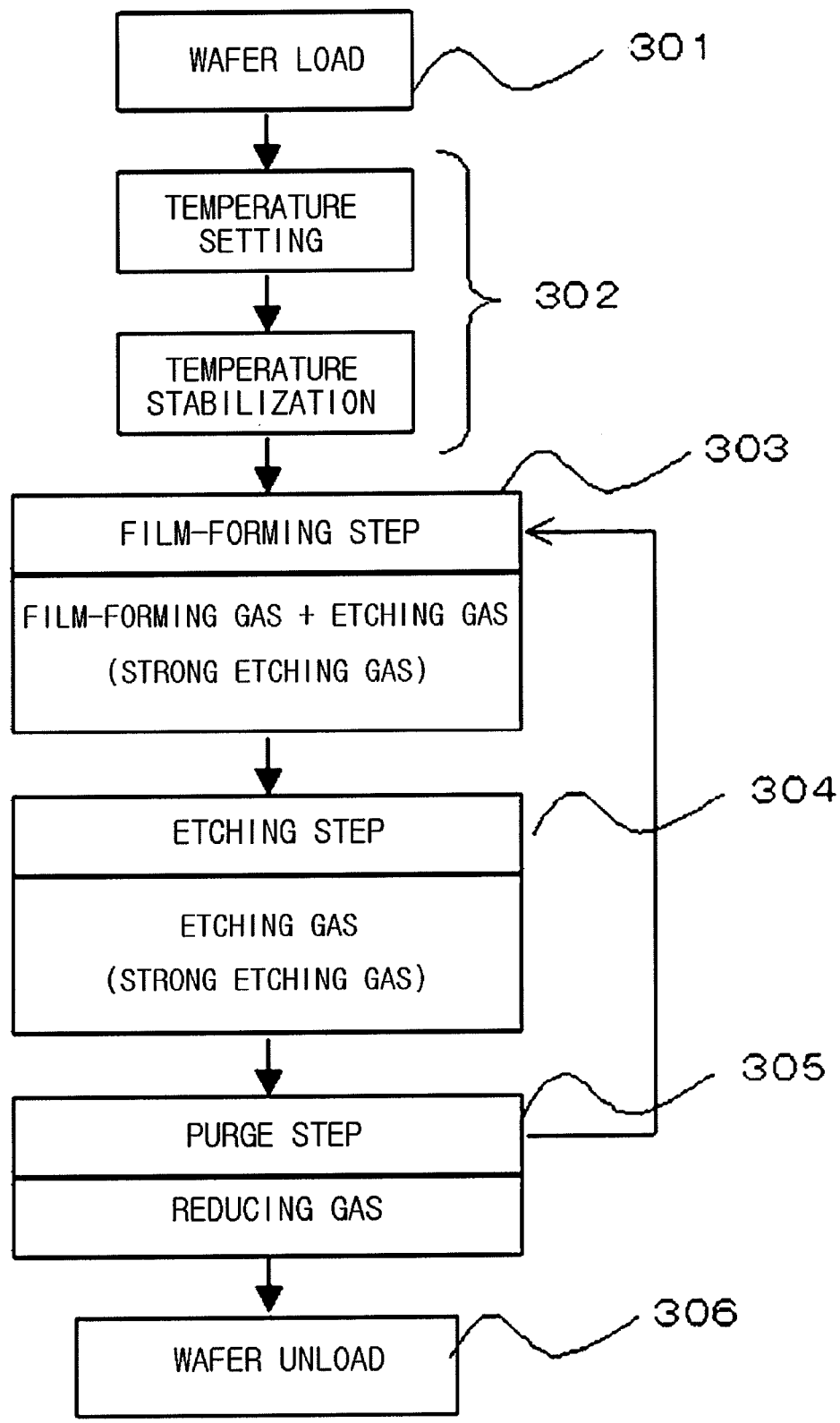
FIG. 3 is a flowchart for explaining a substrate processing method in accordance with a preferred embodiment of the present invention.

Next, explanation will be given on the substrate processing in accordance with the first embodiment of the present invention with reference to the process sequence of FIG. 3.

In the first preferred embodiment of the present invention, the silicon wafer 200 having a silicon nitride film or a silicon oxide film on at least a part of its surface, with a silicon surface being exposed, is loaded into the process chamber 201 (step 301).

Thereafter, the wafer 200 is heated to have a temperature within a temperature range of 650~800° C. (greater than or equal to 650° C. and less than or equal to 800° C.) (step 302).

In the film-forming step being the first step, the dichlorosilane gas as the film-forming gas and the hydrogen chloride gas as the etching gas are simultaneously introduced into the process chamber 201 and irradiated onto the wafer 200 (step 303). In this case, it is preferable that the pressure inside the process chamber 201 is greater than or equal to 100 Pa and less than the atmospheric pressure; the dichlorosilane gas flow rate is 1~300 sccm (greater than or equal to 1 sccm and less than or equal to 300 sccm); the hydrogen chloride gas flow rate is 1~300 sccm (greater than 1 sccm and less than 300 sccm); and the hydrogen gas flow rate is 1~20000 sccm (greater than or equal to 1 sccm and less than or equal to 20000 sccm). In the film-forming step, since those gases are flown from the same nozzle, the film-forming gas and the etching gas alone are prevented from reacting each other, and the gas is supplied so that the selective growth is achieved.

Next, in the etching step being the second step, chlorine gas having higher etchability than the etching gas used in the film-forming step is introduced into the process chamber 201 as the etching gas and irradiated onto the wafer 200 (step 304). In this case, it is preferable that the temperature is the same as that in the first step; the process chamber 201 is at al low pressure in a range between great than or equal to 10 Pa and less than or equal to 50 Pa; and the etching gas is made to reach the central part of the substrate as well as the edge part of the substrate and react thereon. Furthermore, it is preferable that the chlorine gas flow rate is 1~100 sccm (greater than or equal to 1 sccm and less than or equal to 100 sccm). Furthermore, in the second step, the hydrogen gas is flown at a flow rate of 10~5000 sccm (greater than or less than 10 sccm and less than 5000 sccm), preferably 1000~3000 sccm (greater than or equal to 1000 sccm and less than or equal to 3000 sccm).

Then, in order to remove chlorine remaining on the substrate surface, a purge step of supplying a reducing gas, for example, hydrogen gas is performed (step 305).

By performing the film-forming step, the etching step, and the purge step sequentially, the silicon film is selectively epitaxially grown. Furthermore, the film-forming step, the etching step, and the purge step may be sequentially performed a predetermined number of times.

Like in the step 303, by introducing the dichlorosilane gas and the hydrogen chloride gas simultaneously, the dichlorosilane gas is suppressed from reaching in a vapor phase, and a silicon epitaxial growth is selectively achieved only on the silicon surface.

Furthermore, like in the step 304, by introducing the etching gas alone, silicon atomic nuclei attached to the silicon nitride film or the silicon oxide film are removed.

Moreover, like in the step 305, by introducing the reducing gas, chlorine remaining on the substrate surface is removed.

In this way, by repeating the step 303, the step 304 and the step 305 one or more times, the sufficiently thick epitaxial film can be grown while maintaining the selectivity and the film thickness uniformity in the substrate plane.

In the step 303 and the step 304, it is preferable that the flow rate of the hydrogen gas as the carrier gas is 10~50000 sccm (greater than or equal to 10 sccm and less than or equal to 5000 sccm), and the flow rate of the nitrogen gas as the carrier gas is 1~30000 sccm (greater than or equal to 1 sccm and less than or equal to 30000 sccm). The hydrogen gas and the nitrogen gas as the carrier gas are flown simultaneously with the film-forming gas or the etching gas. In the case of flowing the nitrogen gas, another gas supply line including a nitrogen gas supply source, an MFC and a valve is added.

After a desired epitaxial film is selectively grown by repeating the step 303 and the step 304 a predetermined number of times, the supply of gas is cut off and the process chamber 201 is exhausted.

Thereafter, the wafer 200 is unloaded from the process chamber 201 (step 305).

The current embodiment can obtain one or more of the following effects.

(1) In the first step, the silicon substrate having the silicon nitride film or the silicon oxide film on at least a part of its surface, with the silicon surface being exposed, is loaded into the process chamber. Then, the etching gas, such as hydrogen gas, fluoride gas or hydrogen chloride gas is supplied simultaneously with silane-based gas into the process chamber (in the case of growing a SiGe mixed film, germanium-based gas is also supplied). In this way, the silicon epitaxial film is selectively grown only on the silicon surface, while suppressing the silane-based or germanium-based gas from reacting in a vapor phase. In the second step, silicon atoms attached to the silicon nitride film or the silicon oxide film are removed by introducing the etching gas such as chlorine gas having a higher etchability than the etching gas used in the first step. The selective epitaxial growth is achieved by repeating the first step and the second step sequentially at least one or more times. In this way, the sufficiently thick epitaxial film can be grown, while maintaining the selectivity and the film thickness uniformity in the substrate plane.

(2) Since the gas having the weak etchability is used in the film-forming step, it is possible to selectively form a film having excellent film thickness uniformity on the silicon surface over the substrate. Furthermore, by using the gas having the weak etchability, it is possible to prevent only the peripheral part of the substrate from being etched extremely, and it is possible to improve the film thickness uniformity in the substrate plane. Moreover, it is possible to reduce the difference of the etchability due to the film quality of the silicon nitride film, the oxide film, the silicon polycrystalline film or the single-crystal film on the substrate surface.

Furthermore, in the film-forming step, since the etchability is weak, silicon atoms or silicon atomic nuclei are also formed on the insulation film such as the silicon nitride film or the silicon oxide film in the initial stage of the silicon film formation. However, in the etching step, the silicon atoms or the silicon atomic nuclei formed on the insulation film can be removed at a low flow rate in a short time by using the gas having the stronger etchability than the gas used in the film-forming step. Furthermore, since the etching can be achieved at a low temperature in a short time, it is possible to reduce the thermal damage of the substrate, which may cause degradation of device characteristics such as impurity diffusion or shape deformation. Moreover, it is possible to improve the throughput.

<Second Embodiment>

The second embodiment will be described below.

The second embodiment is different from the first embodiment in the process sequence of the substrate processing. Specifically, in the etching step (step 304) being the second step, when the etching gas (for example, chlorine gas) having a stronger etchability than that used in the film-forming gas is introduced into the process chamber 201 and irradiated onto the wafer 200, the flow rate of the etching gas and the pressure condition of the process chamber 201 are different from those of the first embodiment. Other process sequences and the structures and operations of the processing apparatus and process furnace are the same as those of the first embodiment.

In accordance with the current embodiment of the present invention, in the film-forming step 303 being the first step in the first embodiment, the dichlorosilane gas as the film-forming gas and the hydrogen chloride gas as the etching gas are simultaneously introduced into the process chamber 201 and irradiated onto the wafer 200. In this case, as shown in Table 1, the pressure of the process chamber 201 is in a range between greater than or equal to 50 Pa and less than the atmospheric pressure, and the flow rate of the hydrogen chloride gas is in a range between greater than or equal to 1 sccm and less than or equal to 300 sccm. Furthermore, it is preferable that the flow rate of the dichlorosilane gas is in a range between greater than or equal to 1 sccm and less than or equal to 500 sccm, and the flow rate of the hydrogen gas is in a range between greater than or equal to 1 sccm and less than or equal to 20000 sccm.

Moreover, in the etching step (step 304) being the second step, as shown in Table 1, chlorine gas as the gas having the stronger etchability than that used in the film-forming step being the first step is introduced into the process chamber 201 and irradiated onto the wafer 200. In this case, the flow rate of the chlorine gas is in a range between greater than or equal to 1 sccm and less than or equal to 300 sccm. Furthermore, the pressure inside the process chamber 201 is in a range between greater than or equal to 50 Pa and less than the atmospheric pressure.

That is, the film-forming step and the etching step are performed under the same pressure condition of the process chamber 201 and the same flow rate condition of the etching gas as those of the first embodiment.

TABLE 1

|  | Film-forming Step | Etching Step |
| --- | --- | --- |
| Etching Gas Species | HCl | Cl |
| Flow Rate of Etching Gas (sccm) | Greater than or equal to 1 and less than or equal to 300 | Greater than or equal to 1 and less than or equal to 300 |
| Pressure inside Process Chamber (Pa) | Greater than or equal to 50 and less than 101 K | Greater than or equal to 50 and less than 101 K |
| Substrate Temperature (° C.) | Greater than or equal to 650 and less than or equal to 800 | Greater than or equal to 650 and less than or equal to 800 |

In addition to the same effects described in the first embodiment, the current embodiment can suppress the pressure variation inside the process chamber 201, improve the throughput, and simultaneously process the wafer 200 with higher reproducibility.

<Third Embodiment>

The third embodiment will be described below.

The third embodiment is different from the first embodiment in the process sequence of the substrate processing. Specifically, in the etching step (step 304) being the second step, when the etching gas (for example, chlorine gas) having a stronger etchability than that used in the film-forming gas is introduced into the process chamber 201 and irradiated onto the wafer 200, the flow rate of the etching gas and the pressure condition of the process chamber 201 are different from those of the first embodiment. Other process sequences and the structures and operations of the processing apparatus and process furnace are the same as those of the first embodiment.

In accordance with the current embodiment of the present invention, in the film-forming step 303 being the first step in the first embodiment, the dichlorosilane gas as the film-forming gas and the hydrogen chloride gas as the etching gas are simultaneously introduced into the process chamber 201 and irradiated onto the wafer 200. In this case, as shown in Table 2, the pressure of the process chamber 201 is in a range between greater than or equal to 50 Pa and less than the atmospheric pressure, and the flow rate of the hydrogen chloride gas is in a range between greater than or equal to 1 sccm and less than or equal to 300 sccm. Furthermore, it is preferable that the flow rate of the dichlorosilane gas is in a range between greater than or equal to 1 sccm and less than or equal to 500 sccm, and the flow rate of the hydrogen gas is in a range between greater than or equal to 1 sccm and less than or equal to 20000 sccm.

Moreover, in the etching step (step 304) being the second step, as shown in Table 2, chlorine gas as the gas having the stronger etchability than that used in the film-forming step being the first step is introduced into the process chamber 201 and irradiated onto the wafer 200. In this case, the pressure inside the process chamber 201 is in a range between greater than or equal to 1 Pa and less than or equal to 20 Pa. That is, the pressure inside the process chamber 201 in the etching step is lower than that in the film-forming step.

TABLE 2

|  | Film-forming Step | Etching Step |
| --- | --- | --- |
| Etching Gas Species | HCl | Cl |
| Flow Rate of Etching Gas (sccm) | Greater than or equal to 1 and less than or equal to 300 | Greater than or equal to 1 and less than or equal to 300 |
| Pressure inside Process Chamber (Pa) | Greater than or equal to 50 and less than 101 K | Greater than or equal to 1 and less than or equal to 20 |
| Substrate Temperature (° C.) | Greater than or equal to 650 and less than or equal to 800 | Greater than or equal to 650 and less than or equal to 800 |

In addition to the same effects described in the first embodiment, the current embodiment can make the etching gas reach the central part as well as the peripheral part of the substrate and react therein. Thus, silicon atoms or silicon atomic nuclei remaining in the film-forming step can be etched throughout the substrate, thereby etching the substrate surface uniformly.

<Fourth Embodiment>

The fourth embodiment will be described below.

The fourth embodiment is different from the first embodiment in the process sequence of the substrate processing. Specifically, the temperature inside the process chamber 201 especially the temperature condition of the wafer 200 in the film-forming step (step 303) being the first step, and the temperature inside the process chamber 201, especially the temperature condition of the wafer 200, when the etching gas (for example, chlorine gas) having a stronger etchability than that used in the film-forming gas is introduced into the process chamber 201 and irradiated onto the wafer 200, are different from those of the first embodiment. Other process sequences and the structures and operations of the processing apparatus and process furnace are the same as those of the first embodiment.

In accordance with the current embodiment of the present invention, in the film-forming step 303 being the first step in the first embodiment, the dichlorosilane gas as the film-forming gas and the hydrogen chloride gas as the etching gas are simultaneously introduced into the process chamber 201 and irradiated onto the wafer 200. In this case, as shown in Table 3, the pressure of the process chamber 201 is in a range between greater than or equal to 50 Pa and less than the atmospheric pressure, and the flow rate of the hydrogen chloride gas is in a range between greater than or equal to 1 sccm and less than or equal to 300 sccm. As shown in Table 3, the temperature inside the process chamber 201 is in a range between greater than or equal to 650° C. and less than or equal to 800° C. It is preferable that the flow rate of the dichlorosilane gas is in a range between greater than or equal to 1 sccm and less than or equal to 500 sccm, and the flow rate of the hydrogen gas is in a range between greater than or equal to 1 sccm and less than or equal to 20000 sccm.

Moreover, in the etching step (step 304) being the second step, as shown in Table 3, chlorine gas as the etching gas having the stronger etchability than that used in the film-forming step being the first step is introduced into the process chamber 201 and irradiated onto the wafer 200. In this case, the temperature inside the process chamber 201, especially the temperature of the substrate 200, temporarily rises up to higher temperature than that in the film-forming step, between greater than or equal to 650° C. and less than or equal to 800° C. For example, if the temperature inside the process chamber 201 is 650° C. in the film-forming step, it temporarily rises up to 800° C. in the etching step. Accordingly, in the etching step, the etchability can be further increased. In addition, more particularly, the temperature inside the process chamber 201 in the etching step is at the same temperature as the film-forming step when the process proceeds from the film-forming step to the etching step, and once rises up and then falls down to the same temperature as the film-forming step before the etching step is completed. For example, if the temperature inside the process chamber 201 is at 650° C. in the film-forming step, the temperature inside the process chamber 201 is maintained at 650° C. when the process proceeds from the film-forming step to the etching step, and once rises up to 800° C. and then falls down to 650° C., which is the same temperature as the film-forming step, before the etching step is completed. Accordingly, the etching can be performed even when the temperature rises up and falls down, and thus, the etching time can be reduced much more.

TABLE 3

| | Film-forming Step | Etching Step |
| --- | --- | --- |
| Etching Gas Species | HCl | Cl |
| Flow Rate of Etching Gas (sccm) | Greater than or equal to 1 and less than or equal to 300 | Greater than or equal to 1 and less than or equal to 300 |
| Pressure inside Process Chamber (Pa) | Greater than or equal to 50 and less than 101 K | Greater than or equal to 50 and less than 101 K |
| Substrate Temperature (° C.) | Greater than or equal to 650 and less than or equal to 800 (650) | Greater than or equal to 650 and less than or equal to 800 (650→800→650) |

In addition to the same effects described in the first embodiment, the current embodiment can further improve the throughput because the etchability in the etching step is increased. In particular, the film can be formed on the semiconductor substrate without thermal damage of the substrate, which may cause degradation of device characteristics such as impurity diffusion or shape deformation.

<Fifth Embodiment>

The fifth embodiment will be described below.

The fifth embodiment is different from the first embodiment in the process sequence of the substrate processing. Specifically, the pressure condition inside the process chamber 201 in the film-forming step (step 303) being the first step, and the pressure condition inside the process chamber 201 when the same etching gas (for example, hydrogen chloride gas) as that used in the film-forming gas is introduced into the process chamber 201 and irradiated onto the wafer 200 in the etching step (step 304) being the second step, are different from those of the first embodiment. Other process sequences and the structures and operations of the processing apparatus and process furnace are the same as those of the first embodiment.

In accordance with the current embodiment of the present invention, in the film-forming step 303 being the first step in the first embodiment the dichlorosilane gas as the film-forming gas and the hydrogen chloride gas as the etching gas are simultaneously introduced into the process chamber 201 and irradiated onto the wafer 200. In this case, as shown in Table 4, the pressure of the process chamber 201 is in a range between greater than or equal to 1 Pa and less than or equal to 100 Pa, and the flow rate of the hydrogen chloride gas is in a range between greater than or equal to 1 sccm and less than or equal to 300 sccm. As shown in Table 4, the temperature inside the process chamber 201 is in a range between greater than or equal to 650° C. and less than or equal to 800° C. It is preferable that the flow rate of the dichlorosilane gas is in a range between greater than or equal to 1 sccm and less than or equal to 500 sccm, and the flow rate of the hydrogen gas is in a range between greater than or equal to 1 sccm and less than or equal to 20000 sccm.

Moreover, in the etching step (step 304) being the second step, as shown in Table 4, hydrogen chloride gas used in the film-forming step being the first step is used as the etching gas. The hydrogen gas is introduced into the process chamber 201 and irradiated onto the wafer 200. Furthermore, in the etching step, the pressure inside the process chamber 201 when supplying the etching gas is temporarily higher than the pressure inside the process chamber 201 in the film-forming step. For example, in the etching step, the pressure inside the process chamber 201 temporarily rises up to a pressure range between greater than or equal to 500 Pa and less than or equal to 1000 Pa. Therefore, in the etching step, the etchability can be increased.

In addition, more preferably, the pressure inside the process chamber 201 in the etching step is at the same pressure as the film-forming step when the process proceeds from the film-forming step to the etching step, and once rises up and then falls down to the same pressure as the film-forming step before the etching step is completed. For example, if the pressure inside the process chamber 201 is at 100 Pa in the film-forming step, the pressure inside the process chamber 201 is maintained at 100 Pa when the process proceeds from the film-forming step to the etching step, and once rises up to 1000 Pa and then falls down to 100 Pa, which is the same pressure as the film-forming step, before the etching step is completed. Accordingly, the etching can be performed even when the pressure rises up and falls down, and thus, the etching time can be reduced much more.

Without temporarily increasing the pressure inside the process chamber 201 during the etching step, that is, without changing the pressure inside the process chamber 201 during the etching step, the etching can be performed at a constant pressure which has been made higher than that in the film-forming step from the initial stage of the etching step.

TABLE 4

| | Film-forming Step | Etching Step |
| --- | --- | --- |
| Etching Gas Species | HCl | HCl |
| Flow Rate of Etching Gas (sccm) | Greater than or equal to 1 and less than or equal to 300 | Greater than or equal to 1 and less than or equal to 300 |
| Pressure inside Process Chamber (Pa) | Greater than or equal to 1 and less than 100 | Greater than or equal to 100 and less than 1000 (100→1000→100) |
| Substrate Temperature (° C.) | Greater than or equal to 650 and less than or equal to 800 | Greater than or equal to 650 and less than or equal to 800 |

The current embodiment can obtain one or more of the following effects.

(1) In the first step, the silicon substrate having the silicon nitride film or the silicon oxide film on at least a part of its surface, with the silicon surface being exposed, is loaded into the process chamber. Then, the etching gas, such as hydrogen gas, fluoride gas or hydrogen chloride gas is supplied simultaneously with silane-based gas into the process chamber (in the case of growing a SiGe mixed film, germanium-based gas is also supplied). In this way, the silicon epitaxial film is selectively grown only on the silicon surface, while suppressing the silane-based or germanium-based gas from reacting in a vapor phase. In the second step, the pressure inside the process chamber is made higher than that in the film-forming step, and silicon atoms attached to the silicon nitride film or the silicon oxide film are removed by introducing the etching gas used in the film-forming step. The selective epitaxial growth is achieved by repeating the first step and the second step sequentially at least one or more times. In this way, the sufficiently thick epitaxial film can be grown, while maintaining the selectivity and the film thickness uniformity in the substrate plane.

(2) Since the gas having the weak etchability is used in the film-forming step, it is possible to selectively form a film having excellent film thickness uniformity on the silicon surface over the substrate. Furthermore, by using the gas having the weak etchability, it is possible to prevent only the peripheral part of the substrate from being etched extremely, and it is possible to improve the film thickness uniformity in the substrate plane. Moreover, it is possible to reduce the difference of the etchability due to the film quality of the silicon nitride film, the oxide film, the silicon polycrystalline film or the single-crystal film on the substrate surface.

Furthermore, since the etchability is weak in the film-forming step, silicon atomic nuclei are also formed on the insulation film such as the silicon nitride film or the silicon oxide film in the initial stage of the silicon film formation. However, the silicon atoms or silicon atomic nuclei formed on the insulation film in the film-forming step can be removed at a low flow rate in a short time by using the same etching gas as in the film-forming step, and making the pressure inside the process chamber higher than that in the film-forming step. Furthermore, since the etching can be achieved at a low temperature in a short time, it is possible to reduce the thermal damage of the substrate, which may cause degradation of device characteristics such as impurity diffusion or shape deformation. Moreover, it is possible to improve the throughput.

<Sixth Embodiment>

The sixth embodiment will be described below.

The sixth embodiment is different from the first embodiment in the process sequence of the substrate processing. Specifically, in the etching step (step 304) being the second step, the hydrogen chloride gas used in the film-forming step is used as the etching gas. When the etching gas is introduced into the process chamber 201 and irradiated onto the wafer 200, the flow rate of the etching gas is different from that in the first embodiment. Other process sequences and the structures and operations of the processing apparatus and process furnace are the same as those of the first embodiment.

In accordance with the current embodiment of the present invention, in the film-forming step 303 being the first step in the first embodiment, the dichlorosilane gas as the film-forming gas and the hydrogen chloride gas as the etching gas are simultaneously introduced into the process chamber 201 and irradiated onto the wafer 200. In this case, as shown in Table 5, the pressure of the process chamber 201 is in a range between greater than or equal to 50 Pa and less than the atmospheric pressure, and the flow rate of the hydrogen chloride gas is in a range between greater than or equal to 1 sccm and less than or equal to 300 sccm. In addition, it is preferable that the flow rate of the dichlorosilane gas is in a range between greater than or equal to 1 sccm and less than or equal to 500 sccm, and the flow rate of the hydrogen gas is in a range between greater than or equal to 1 sccm and less than or equal to 20000 sccm.

Moreover, in the etching step (step 304) being the second step, as shown in Table 5, when the etching gas is introduced into the process chamber 201 and irradiated onto the wafer 200, the hydrogen chloride gas used in the film-forming step being the first step is also used as the etching gas. Furthermore, the gas flow rate in the etching step when supplying the etching gas is much more than that in the film-forming step. For example, the flow rate of the etching gas supplied into the process chamber 201 in the etching step is in a range between greater than or equal to 5000 sccm and less than or equal to 10000 sccm. Therefore, in the etching step, the etchability can be increased.

TABLE 5

| | Film-forming Step | Etching Step |
| --- | --- | --- |
| Etching Gas Species | HCl | HCl |
| Flow Rate of Etching Gas (sccm) | Greater than or equal to 1 and less than or equal to 300 | Greater than or equal to 5000 and less than or equal to 10000 |
| Pressure inside Process Chamber (Pa) | Greater than or equal to 50 and less than 101 K | Greater than or equal to 50 and less than 101 K |
| Substrate Temperature (° C.) | Greater than or equal to 650 and less than or equal to 800 | Greater than or equal to 650 and less than or equal to 800 |

The current embodiment can obtain one or more of the following effects.

(1) In the first step, the silicon substrate having the silicon nitride film or the silicon oxide film on at least a part of its surface, with the silicon surface being exposed, is loaded into the process chamber. Then, the etching gas, such as hydrogen gas, fluoride gas or hydrogen chloride gas is introduced simultaneously with silane-based gas into the process chamber (in the case of growing a SiGe mixed film, germanium-based gas is also supplied). In this way, the silicon epitaxial film is selectively grown only on the silicon surface, while suppressing the silane-based or germanium-based gas from reacting in a vapor phase. In the second step, the etching gas used in the film-forming step is introduced into the process chamber 201 at a higher flow rate than that of the film-forming step, and silicon atoms attached to the silicon nitride film or the silicon oxide film are removed. The selective epitaxial growth is achieved by repeating the first step and the second step sequentially at least one or more times. In this way, the sufficiently thick epitaxial film can be grown, while maintaining the selectivity and the film thickness uniformity in the substrate plane.

(2) Since the gas having the weak etchability is used in the film-forming step, it is possible to selectively form a film having excellent film thickness uniformity on the silicon surface over the substrate. Furthermore, by using the gas having the weak etchability, it is possible to prevent only the peripheral part of the substrate from being etched extremely, and it is possible to improve the film thickness uniformity in the substrate plane. Moreover, it is possible to reduce the difference of the etchability due to the film quality of the silicon nitride film, the oxide film, the silicon polycrystalline film or the single-crystal film on the substrate surface.

Furthermore, since the etchability is weak in the film-forming step, silicon atomic nuclei are also formed on the insulation film such as the silicon nitride film or the silicon oxide film in the initial stage of the silicon film formation. However, the silicon atoms or silicon atomic nuclei formed on the insulation film in the film-forming step can be removed at a low flow rate in a short time by using the same etching gas as in the film-forming step and by supplying the etching gas into the process chamber 201 at the higher flow rate than that of the film-forming step. Furthermore, since the etching can be achieved at a low temperature in a short time, it is possible to reduce the thermal damage of the substrate, which may cause degradation of device characteristics such as impurity diffusion or shape deformation. Moreover, it is possible to improve the throughput.

<Seventh Embodiment>

The seventh embodiment will be described below.

The seventh embodiment is different from the first embodiment in the process sequence of the substrate processing. Specifically, unlike the first embodiment, in the etching step (step 304) being the second step, the film-forming gas and the reducing gas introduced in the film-forming step being the first step are also introduced into the process chamber 201, and chlorine gas having a stronger than etchability than the etching gas used in the film-forming step is introduced into the process chamber 201. Other process sequences and the structures and operations of the processing apparatus and process furnace are the same as those of the first embodiment.

In accordance with the current embodiment of the present invention, as shown in Table 6, in the film-forming step 303 being the first step, the dichlorosilane gas as the film-forming gas and the hydrogen chloride gas as the etching gas are simultaneously introduced into the process chamber 201 and irradiated onto the wafer 200. In this case, as shown in Table 6, the temperature of the wafer 200 is in a range between greater than or equal to 650° C. and less than or equal to 800° C., the pressure of the process chamber 201 is in a range between greater than or equal to 50 Pa and less than the atmospheric pressure, and the flow rate of the hydrogen chloride gas is in a range between greater than or equal to 1 sccm and less than or equal to 300 sccm. Furthermore, it is preferable that the flow rate of the dichlorosilane gas is in a range between greater than or equal to 1 sccm and less than or equal to 500 sccm, and the flow rate of the hydrogen gas is in a range between greater than or equal to 1 sccm and less than or equal to 20000 sccm. Under those conditions, the film-forming step as a strong film-forming step is performed. Furthermore, in a weak film-forming step as the etching step (step 304) after the step 303, gas having a higher etchability than the etching gas (for example, hydrogen chloride gas) used in the film-forming step is used. For example, the chlorine gas is supplied into the process chamber 201 at a flow rate ranging between greater than or equal to 1 sccm and less than or equal to 300 sccm, and other conditions are the same as those of the film-forming step (the temperature of the wafer 200 is in a range between greater than or equal to 650° C. and less than or equal to 800° C., the pressure of the process chamber 201 is in a range between greater than or equal to 50 Pa and less than the atmospheric pressure, and the flow rate of the dichlorosilane gas is in a range between greater than or equal to 1 sccm and less than or equal to 500 sccm, and the flow rate of the hydrogen gas is in a range between greater than or equal to 1 sccm and less than or equal to 20000 sccm). That is, by using the stronger etching gas than that in the strong film-forming step, the weak film-forming step is performed with the stronger etchability than in the film-forming step 303.

TABLE 6

| | Film-forming Step (Strong film-Forming Step) | Etching Step (Weak Film-forming Step) |
|---|---|---|
| Film-forming Gas Species | SiH2Cl2 | SiH2Cl2 |
| Reducing Gas Species | H2 | H2 |
| Etching Gas Species | HCl | Cl |
| Flow Rate of Film-forming Gas (sccm) | Greater than or equal to 1 and less than or equal to 500 | Greater than or equal to 1 and less than or equal to 500 |
| Flow Rate of Reducing Gas (sccm) | Greater than or equal to 1 and less than or equal to 20000 | Greater than or equal to 1 and less than or equal to 20000 |
| Flow rate of Etching Gas (sccm) | Greater than or equal to 1 and less than or equal to 300 | Greater than or equal to 1 and less than or equal to 300 |
| Pressure inside Process Chamber (Pa) | Greater than or equal to 50 and less than 101 K | Greater than or equal to 50 and less than 101 K |
| Substrate Temperature (° C.) | Greater than or equal to 650 and less than or equal to 800 | Greater than or equal to 650 and less than or equal to 800 |

In addition to the same effects described in the first embodiment, the current embodiment can further increase the film-forming speed and improve the throughput because the film-forming gas is supplied into the process chamber in the etching speed.

<Eighth Embodiment>

The eighth embodiment will be described below.

The eighth embodiment is different from the first embodiment in the process sequence of the substrate processing. Specifically, unlike the first embodiment, in the etching step (step 304) being the second step, the film-forming gas, the reducing gas and the etching gas introduced in the film-forming step being the first step are also introduced into the process chamber 201. Also, the etching step is performed under the conditions that the temperature inside the process chamber 201, especially the temperature of the wafer 200, is made lower than the temperature in the film-forming step and lower than a pyrolysis temperature of the film-forming gas. Other process sequences and the structures and operations of the processing apparatus and process furnace are the same as those of the first embodiment.

In accordance with the current embodiment of the present invention, as shown in Table 7, in the film-forming step 303 being the first step, the dichlorosilane gas as the film-forming gas and the hydrogen chloride gas as the etching gas are simultaneously introduced into the process chamber 201 and irradiated onto the wafer 200. In this case, as shown in Table 7, the temperature of the wafer 200 is in a range between greater than or equal to 650° C. and less than or equal to 800° C., the pressure of the process chamber 201 is in a range between greater than or equal to 50 Pa and less than the atmospheric pressure, and the flow rate of the hydrogen chloride gas is in a range between greater than or equal to 1 sccm and less than or equal to 300 sccm. Furthermore, it is preferable that the flow rate of the dichlorosilane gas is in a range between greater than or equal to 1 sccm and less than or equal to 500 sccm, and the flow rate of the hydrogen gas is in a range between greater than or equal to 1 sccm and less than or equal to 20000 sccm. Under those conditions, the film-forming step as a strong film-forming step is performed. Furthermore, in the etching step (step 304) after the step 303, the temperature inside the process chamber 201 is made lower than that in the film-forming step and lower than a pyrolysis temperature of the film-forming gas. For example, in the etching step, the temperature inside the process chamber 201, especially the temperature of the wafer 200, is in a range between greater than or equal to 500° C. and less than or equal to 600° C. at which the dichlorosilane gas is difficult to pyrolyze. Furthermore, gas having a higher etchability than the etching gas (for example, hydrogen chloride gas) used in the film-forming step is used. For example, the chlorine gas is supplied into the process chamber 201 at a flow rate ranging between greater than or equal to 1 sccm and less than or equal to 300 sccm, and other conditions are the same as those of the film-forming step (the pressure of the process chamber 201 is in a range between greater than or equal to 50 Pa and less than the atmospheric pressure, the flow rate of the dichlorosilane gas is in a range between greater than or equal to 1 sccm and less than or equal to 500 sccm, and the flow rate of the hydrogen gas is in a range between greater than or equal to 1 sccm and less than or equal to 20000 sccm). That is, by using the stronger etching gas than that in the strong film-forming step, the etching step is performed with the stronger etchability than in the film-forming step 303. Also, even though the film-forming gas flows during the etching step, the film is not formed on the wafer 200.

TABLE 7

|  | Film-forming Step (Strong film-Forming Step) | Etching Step (Weak Film-forming Step) |
|---|---|---|
| Film-forming Gas Species | SiH2Cl2 | SiH2Cl2 |
| Reducing Gas Species | H2 | H2 |
| Etching Gas Species | HCl | HCl |
| Flow Rate of Film-forming Gas (sccm) | Greater than or equal to 1 and less than or equal to 500 | Greater than or equal to 1 and Less than or equal to 500 |
| Flow Rate of Reducing Gas (sccm) | Greater than or equal to 1 and less than or equal to 20000 | Greater than or equal to 1 and less than or equal to 20000 |
| Flow rate of Etching Gas (sccm) | Greater than or equal to 1 and less than or equal to 300 | Greater than or equal to 1 and less than or equal to 300 |
| Pressure inside Process Chamber (Pa) | Greater than or equal to 50 and less than 101 K | Greater than or equal to 50 and less than 101 K |
| Substrate Temperature (° C.) | Greater than or equal to 650 and less than or equal to 800 | Greater than or equal to 500 and less than or equal to 600 |

In addition to the same effects described in the first embodiment, the current embodiment can change the film-forming step to the etching step without changing conditions other than temperature.

<Other Embodiments>

In addition to the first embodiment to the eighth embodiment, several modifications are also possible.

For example, in the first embodiment to the fourth embodiment and the seventh embodiment, since the kinds of the etching gas are different in the film-forming step 303 and the etching step 304, a purge step may be performed between the film-forming step 303 and the etching step 304 by supplying a reducing gas, for example, hydrogen gas into the process chamber 201, without supplying the etching gas and the film-forming gas into the process chamber 201. Furthermore, preferably, the step of evacuating the inside of the process chamber 201 and removing all residual gas inside the process chamber 201 in the film-forming step may be performed between the film-forming step 303 and the etching step 304. By adding those purge steps, even though the gas species is changed in the film-forming step and the etching step, it is possible to suppress the problem that mixes with the residual gas in the film-forming step within the gas supply pipe. Thus, the gas can be supplied from the same gas supply port under the better conditions.

Furthermore, in the above-described embodiment, although the loadlock chamber capable of vacuum substitution has been described as the preliminary chamber, a purified structure which is not capable of vacuum substitution and configured with nitrogen gas atmosphere or clean air atmosphere may be used instead of the loadlock chamber in the case of performing a process having no critical importance, such as attachment of a natural oxide film to the substrate. Moreover, in this case, a simple housing may be used instead of the pressure-resistant housing.

Furthermore, in the above-described embodiment, although the plasma generation device is not installed in the gas supply unit or the process chamber and the process is performed in the non-plasma state, the present invention is not limited thereto. For example, the process may be performed in the plasma state by installing the plasma generation device in the gas supply unit or the process chamber.

Furthermore, in the above-described embodiment, the gas supply pipe 232 is divided into four branched pipes at the upstream side, which are respectively connected to the first gas supply source 501, the second gas supply source 502, the third gas supply source 503 and the fourth gas supply source 504 through the valves 521, 522, 523 and 524 and the mass flow controllers (MFCs) 511, 522, 523 and 524 as gas flow rate control devices. However, the gas supply pipe 232 may be installed with separate bodies with respect to the film-forming gas, the inert gas, the etching gas, and other gas species. In this case, four gas supply pipes are installed, and four gas supply pipes (gas supply nozzles) are erected within the process chamber 201. Moreover, the present invention is not limited to the above structure, but various modifications can be made.

Furthermore, by applying the third embodiment to the seventh embodiment, the pressure inside the process chamber 201 in the etching step (weak film-forming step) being the seventh embodiment may be made lower than the pressure inside the process chamber 201 in the film-forming step (strong film-forming step). Moreover, by applying the fourth embodiment to the seventh embodiment, the temperature inside the process chamber 201 in the etching step (weak film-forming step) being the seventh embodiment may be made higher than the temperature inside the process chamber 201 in the film-forming step (strong film-forming step).

Furthermore, in the above-described embodiment, although the selectively epitaxial silicon film using the dichlorosilane being the silicon-based chloride material has been exemplified, it is also possible to apply to the film formation using other silicon-based chloride material such as chlorosilan or trichlorosilane, and the film formation using silicon-based hydride material such as monosilane or disilane.

Furthermore, the above-described embodiment can be applied to a selective epitaxial silicon germanium film. In the case of the selective epitaxial silicon germanium film, for example, the film-forming step is performed under the process conditions that the temperature of the wafer is in a range between greater than or equal to 400° C. and less than or equal to 1000° C., the pressure is in a range between greater than or equal to 1 Pa and less than or equal to 100 Pa, the flow rate of hydrogen gas is in a range between greater than or equal to 1 sccm and less than or equal to 20000 sccm, the flow rate of monosilane gas is in a range between greater than or equal to 1 sccm and less than or equal to 3000, the flow rate of monogermane (germanium etrahydride, $GeH_4$) is in a range between greater than or equal to 1 sccm and less than or equal to 3000 sccm, and the flow rate of hydrogen chloride gas is in a range between greater than or equal to 1 sccm and less than or equal to 1000 sccm. In the above-described embodiment, the etching step (including weak film-forming step) is appropriately performed.

(Supplementary Note)

The present invention also includes the following embodiments.

(Supplementary Note 1)

In accordance with an embodiment of the present invention, there is provided a method of manufacturing a semiconductor device, comprising: (a) loading a substrate into a process chamber, wherein the substrate has at least a silicon exposure surface and an exposure surface of silicon oxide film or silicon nitride film on a substrate surface; (b) simultaneously supplying at least a first process gas containing silicon and a second process gas for etching into the process chamber under conditions that the substrate inside the process chamber is heated to a predetermined temperature; and (c) supplying a third process gas having a stronger etchability than the second process gas into the process chamber, wherein the operation (b) and the operation (c) are performed at least one or more times so that an epitaxial film is selectively grown on the silicon exposure surface of the substrate surface.

(Supplementary Note 2)

In the method of Supplementary Note 1, a film is formed on the silicon exposure surface of the substrate in the operation (b), and silicon nuclei on the silicon oxide film or the silicon nitride film are removed in the operation (c).

(Supplementary Note 3)

In the method of Supplementary Note 2, pressure inside the process chamber in the operation (c) is lower than pressure inside the process chamber in the operation (b).

(Supplementary Note 4)

In the method of Supplementary Note 2, pressure inside the process chamber in the operation (c) is temporarily lower than pressure inside the process chamber in the operation (b).

(Supplementary Note 5)

In the method of Supplementary Note 2, pressure inside the process chamber in the operation (c) is equal to a first pressure inside the process chamber in the operation (b) when changing from the operation (b) to the operation (c), temporarily rises to higher than the first pressure, and thereafter returns to the firs pressure.

(Supplementary Note 6)

In the method of Supplementary Note 2, a flow rate of the third process gas into the process chamber in the operation (c) is higher than a flow rate of the second process gas in the operation (b).

(Supplementary Note 7)

In the method of Supplementary Note 2, temperature of the substrate in the operation (c) is higher than the predetermined temperature in the operation (b).

(Supplementary Note 8)

In the method of Supplementary Note 2, temperature of the substrate in the operation (c) is temporarily higher than the predetermined temperature in the operation (b).

(Supplementary Note 9)

In the method of Supplementary Note 2, temperature of the substrate is equal to the predetermined temperature when changing from the operation (b) to the operation (c), temporarily rises to higher than the predetermined temperature, and thereafter returns to the predetermined temperature.

(Supplementary Note 10)

In the method of Supplementary Note 2, in the operation (c), the first process gas is supplied into the process chamber.

(Supplementary Note 11)

In accordance with another embodiment of the present invention, there is provided a method of manufacturing a semiconductor device, comprising: (a) loading a substrate into a process chamber, wherein the substrate has at least a silicon exposure surface and an exposure surface of silicon oxide film or silicon nitride film on a substrate surface; (b) selectively forming a film on the silicon exposure surface of the substrate by supplying at least a first process gas containing silicon and a second process gas for etching into the process chamber at a first flow rate under conditions that pressure inside the process chamber is at a first pressure and the substrate inside the process chamber is heated to a first temperature; and (c) removing silicon nuclei on the silicon oxide film or the silicon nitride film under conditions that the pressure inside the process chamber is made higher than the first pressure, or the second process gas is supplied at a flow rate higher than the first flow rate, or the temperature of the substrate is lower than the first temperature and lower than a pyrolysis temperature of the first process gas, wherein the operation (b) and the operation (c) are performed at least one or more times.

(Supplementary Note 12)

In the method of Supplementary Note 11, the operation (c) is performed under conditions that the temperature of the substrate is at the first temperature, the flow rate of the second process gas is equal to the first flow rate, and the pressure inside the process chamber is higher than the first pressure.

(Supplementary Note 13)

In the method of Supplementary Note 11, the operation (c) is performed under conditions that the temperature of the substrate is at the first temperature, the inside of the process chamber is at the first pressure, and the flow rate of the second process gas is higher than the first flow rate.

(Supplementary Note 14)

In the method of Supplementary Note 11, the operation (c) is performed under conditions that the inside of the process chamber is at the first pressure, the second process gas is supplied at the first flow rate, the first process gas is supplied into the process chamber, and the temperature of the substrate is lower than the first temperature and lower than a pyrolysis temperature of the first process gas.

(Supplementary Note 15)

In accordance with another aspect of the present invention, there is provided a substrate processing apparatus comprising: a process chamber accommodating a substrate; a heating mechanism heating the substrate; a gas supply unit supplying a process gas into the process chamber in order to form a predetermined film; a gas exhaust unit exhausting atmosphere inside the process chamber by making the inside of the process chamber to a predetermined pressure; and a control unit controlling the heating mechanism, the gas supply unit, and the gas exhaust unit, so that a film is selectively formed on a silicon exposure surface of the substrate by supplying at least a first process gas containing silicon and a second process gas for etching into the process chamber under conditions that pressure inside the process chamber is at a first pressure and the substrate inside the process chamber is heated to a first temperature, and silicon nuclei on silicon oxide film or silicon nitride film are removed under conditions that the pressure inside the process chamber is made higher than the first pressure, or the temperature of the substrate inside the process chamber is higher than the first temperature, or a third process gas having a stronger etchability than the second process gas is supplied.

What is claimed is:

1. A method of manufacturing a semiconductor device, comprising:
   (a) loading a substrate into a process chamber, the substrate having at least an exposed silicon surface and an exposed surface of silicon oxide film or silicon nitride film on a substrate surface;
   (b) simultaneously supplying at least a first process gas containing silicon and a second process gas for etching into the process chamber under a condition that the substrate inside the process chamber is heated to a predetermined temperature; and
   (c) supplying a third process gas having a etchability higher than that of the second process gas into the process chamber,
   wherein steps (b) and (c) are performed one or more times so that an epitaxial film is selectively grown on the exposed silicon surface of the substrate surface, and
   wherein a temperature of the substrate is maintained at the predetermined temperature when proceeding from step (b) to step (c), and the temperature of the substrate is temporarily elevated to be higher than the predetermined temperature in step (c) and then returned to the predetermined temperature in step (c).

2. The method of claim 1, wherein a film is formed on the exposed silicon surface of the substrate in step (b), and silicon nuclei on the silicon oxide film or the silicon nitride film are removed in step (c).

3. The method of claim 2, wherein an inside pressure of the process chamber in step (c) is lower than the inside pressure of the process chamber in step (b).

4. The method of claim 2, wherein an inside pressure of the process chamber in step (c) is temporarily lower than the inside pressure of the process chamber in step (b).

5. The method of claim 2, wherein an inside pressure of the process chamber in step (c) is maintained at a first inside pressure of the process chamber in step (b) when proceeding from step (b) to step (c), is temporarily elevated to be higher than the first pressure, and is thereafter returned to the first pressure.

6. The method of claim 2, wherein a flow rate of the third process gas supplied into the process chamber in step (c) is higher than a flow rate of the second process gas in step (b).

7. The method of claim 2, wherein in step (c), the first process gas is supplied into the process chamber.

8. A method of manufacturing a semiconductor device, comprising:
   (a) loading a substrate into a process chamber, the substrate having at least an exposed silicon surface and an exposed surface of silicon oxide film or silicon nitride film on a substrate surface;
   (b) selectively forming a film on the exposed silicon surface of the substrate by supplying at least a first process gas containing silicon and a second process gas for etching into the process chamber at a first flow rate under conditions that an inside pressure of the process chamber is at a first pressure and the substrate inside the process chamber is heated to a first temperature; and
   (c) removing silicon nuclei on the silicon oxide film or the silicon nitride film under one of conditions that the inside pressure of the process chamber is adjusted to be higher than the first pressure and the second process gas is supplied at a flow rate higher than the first flow rate,
   wherein step (b) and step (c) are performed one or more times, and
   wherein a temperature of the substrate is maintained at the first temperature when proceeding from step (b) to step (c), and the temperature of the substrate is temporarily elevated to be higher than the predetermined temperature in step (c) and then returned to the predetermined temperature in step (c) to selectively grow an epitaxial film on the exposed silicon surface of the substrate surface.

* * * * *